United States Patent
Toutsuka et al.

(10) Patent No.: US 7,691,200 B2
(45) Date of Patent: Apr. 6, 2010

(54) MAGNESIUM OXIDE SINGLE CRYSTAL AND METHOD FOR PRODUCING THE SAME

(75) Inventors: Atsuo Toutsuka, Hyogo (JP); Yoshifumi Kawaguchi, Hyogo (JP); Masaaki Kunishige, Hyogo (JP)

(73) Assignee: Tateho Chemical Industries Co., Ltd, Hyogo (JP)

( * ) Notice: Subject to any disclaimer, the term of this patent is extended or adjusted under 35 U.S.C. 154(b) by 104 days.

(21) Appl. No.: 11/909,505

(22) PCT Filed: Mar. 24, 2006

(86) PCT No.: PCT/JP2006/305926
§ 371 (c)(1),
(2), (4) Date: Sep. 24, 2007

(87) PCT Pub. No.: WO2006/104027
PCT Pub. Date: Oct. 5, 2006

(65) Prior Publication Data
US 2009/0053131 A1    Feb. 26, 2009

(30) Foreign Application Priority Data
Mar. 25, 2005    (JP) .............................. 2005-087967

(51) Int. Cl.
*C30B 13/00* (2006.01)
*C30B 21/04* (2006.01)
*C30B 28/08* (2006.01)
*C21B 11/10* (2006.01)
*C21B 13/12* (2006.01)
*C01F 5/02* (2006.01)
*C01F 5/14* (2006.01)
*C04B 35/00* (2006.01)

(52) U.S. Cl. .................. 117/47; 75/10.47; 423/635; 501/108; 501/122

(58) Field of Classification Search ............... 75/10.47; 106/801; 166/242.9; 423/594.16, 635; 501/101, 501/108, 122; 502/251; 523/457; 117/2, 117/3, 12, 13, 47, 53, 922, 939, 944
See application file for complete search history.

(56) References Cited

U.S. PATENT DOCUMENTS
5,372,992 A * 12/1994 Itozaki et al. ............... 505/238

FOREIGN PATENT DOCUMENTS

| JP | 02-263794 | 10/1990 |
|---|---|---|
| JP | 03-215316 A | 9/1991 |
| JP | 05-170430 | 7/1993 |
| JP | 06-305887 A | 11/1994 |
| JP | 09-309799 | 12/1997 |
| JP | 10-297956 | 11/1998 |
| JP | 11-349399 | 12/1999 |
| JP | 2000-063171 | 2/2000 |
| JP | 2000-086400 | 3/2000 |
| JP | 2000-103614 A | 4/2000 |
| JP | 2000-290062 | 10/2000 |
| JP | 2004-043955 | 2/2004 |
| JP | 2004-043956 | 2/2004 |
| JP | 2004-084016 | 3/2004 |
| JP | 2005149743 A * | 6/2005 |

OTHER PUBLICATIONS

S. Dolgov; E. Feldbach; A.Karkkanen, T. Karner; P. Liblik; A. Maaroos; S. Nakonechnyi. Low-temperature (4-295 K) thermoluminescence of pure and Ca-doped MgO single crystals, Phys. Stat. Sol. (C) 2, No. 1, 422-425 (2005).*

M. M. Abraham; C. T. Butler; Y. Chen. Growth of High-Purity and Doped Alkaline Earth Oxides: I. MgO and CaO. J. Chem. Phys. 55(8), 1971, 3752-3756.*

I. Sakaguchi, H. Yurimoto, and S. Sueno. Calcium Diffusion along High-Diffusion Paths in Single-Crystal MgO, J. Am. Ceram. Soc. 1992, 75(3), 712-715.*

C.T. Butler et al., Arc-fusion growth and characterization of high-purity MgO crystals, Journal of crystal growth, 1971 Nen, vol. 8, pp. 197-204.

* cited by examiner

*Primary Examiner*—Jerry Lorengo
*Assistant Examiner*—Carlos Barcena
(74) *Attorney, Agent, or Firm*—Lucas & Mercanti, LLP

(57) ABSTRACT

Provided is a MgO single crystal for obtaining a magnesium oxide (MgO) single crystal deposition material which is prevented from splashing during the vapor deposition in, e.g., an electron beam deposition method without reducing the deposition rate, and for obtaining a MgO single crystal substrate which can form thereon, e.g., a superconductor thin film having excellent superconducting properties. A MgO single crystal having a calcium content of $150 \times 10^{-6}$ to $1,000 \times 10^{-6}$ kg/kg and a silicon content of $10 \times 10^{-6}$ kg/kg or less, wherein the MgO single crystal has a variation of 30% or less in terms of a CV value in detected amounts of calcium fragment ions, as analyzed by TOF-SIMS with respect to the polished surface of the MgO single crystal. A MgO single crystal deposition material and a MgO single crystal substrate for forming a thin film obtained from the MgO single crystal.

4 Claims, No Drawings

MAGNESIUM OXIDE SINGLE CRYSTAL AND METHOD FOR PRODUCING THE SAME

FIELD OF THE INVENTION

The present invention relates to a magnesium oxide (MgO) single crystal used as a deposition source in producing, e.g., a protective film for plasma display panel (hereinafter, referred to as "PDP") using a vacuum deposition method, such as an electron beam deposition method or an ion plating method, a MgO single crystal for obtaining a MgO single crystal substrate for forming, e.g., an oxide superconductor thin film, and a method for producing the same.

BACKGROUND ART

A PDP utilizing a discharge emission phenomenon is being developed as a flat display which is easily increased in size. In an AC-type PDP having a structure comprising a transparent electrode covered with a glass dielectric, a protective film is generally formed on the dielectric to prevent the increase of discharge voltage due to damage of a surface of the dielectric by sputtering of ion bombardment. This protective film is required to have a low discharge voltage and an excellent resistance to sputtering.

A MgO film has conventionally been used as a protective film that satisfies the above requirement. The MgO film is an insulator having an excellent resistance to sputtering and a large emission coefficient of secondary electrons, and hence can lower discharge start voltage, thus extending the life of a PDP.

Currently, a MgO film is generally formed by depositing a film on a dielectric using a MgO deposition material by a vacuum deposition method, such as an electron beam deposition method or an ion plating method. As a MgO deposition material, for example, a material obtained by pulverizing a sintered material of high-purity polycrystalline MgO or a MgO single crystal is used.

The sintered material of polycrystalline MgO has a low deposition rate, and is likely to splash during the deposition when it is used as a deposition material, which makes it difficult to obtain a uniform protective film. For solving the problem, sintered pellets of polycrystalline MgO having high purity and high density and having an average crystal grain size controlled in a specific range, or sintered pellets of polycrystalline MgO having high purity and high density and having a specific carbon content or less have been proposed wherein the sintered pellets are unlikely to splash during the vapor deposition and forming a uniform protective film, when they are used as a deposition material (patent documents 1 and 2).

Further, a deposition material comprised of a sintered material of polycrystalline MgO having a specific volume or surface roughness has been proposed in order to increase a substantial surface area of the deposition material of a region irradiated with an electron beam for improving the deposition rate (patent documents 3, 4 and 5). A sintered material of polycrystalline MgO having a deposition rate improved by dispersing a specific amount of an alkaline earth metal oxide in the material has been proposed (patent document 6).

The sintered materials of polycrystalline MgO obtained by the above improved method improved deposition rates during the vapor deposition or prevented from splashing to some extent, but a satisfactory protective film cannot be obtained. In addition, the polycrystalline sintered material inherently has lattice strain concentrated in a grain boundary, and is likely to have an uneven grain boundary concentration exposed through the surface of the deposition material, which causes a fundamental problem in that amounts of evaporation of the MgO varies easily.

On the other hand, as a method for obtaining a MgO single crystal deposition material with high productivity, a method in which a MgO single crystal is pulverized by impact force of a rotating cutter is employed. The deposition material obtained by pulverizing a MgO single crystal has a relatively high deposition rate, and forms an excellent protective film. However, the MgO single crystal deposition material produced by the pulverizing method often splashes during the deposition due to its indefinite form. Therefore, particularly when deposited on a large-size substrate, a problem occurs in that it is difficult to obtain a protective film having uniform quality.

For solving the problem, a particle size of MgO is optimized depending on a deposition machine and deposition conditions to obtain a good balance between the deposition rate and the frequency of splashing, improving both the productivity and the quality of film. The MgO single crystal having a particle size optimized is improved in deposition rate; however, it cannot be satisfactorily prevented from splashing during the deposition, and hence is not satisfactory from the viewpoint of achieving uniformity of the MgO film ultimately obtained.

A MgO deposition material having a water resistance improved by controlling the calcium oxide (CaO) content and silicon dioxide ($SiO_2$) content of a MgO single crystal and a ratio between them has been proposed (patent document 7). When this deposition material is used, the time to achieve a certain vacuum range is shortened, but it is difficult to obtain a uniform protective film having excellent quality.

The MgO single crystal is not only used as a deposition material but also frequently used as a substrate on which an oxide superconductor thin film is formed since the MgO single crystal has excellent lattice match with an oxide superconductor and further has a thermal expansion coefficient that is consistent with that of an oxide superconductor. Particularly, the MgO single crystal has a low permittivity and a small dielectric loss at a high frequency, and therefore has attracted attention as a substrate of an oxide superconductor thin film for use in a high frequency device.

A variety of methods for improving the above MgO single crystal substrates for oxide superconductors, for example, a method of obtaining a single crystal having a large size (patent documents 8 and 9), a method of obtaining a single crystal having excellent crystallinity (patent document 10), a method of improving surface properties of a substrate (patent documents 11, 12, and 13), and others have been proposed. However, a satisfactory oxide superconductor thin film cannot be obtained.

[Patent document 1] Japanese Unexamined Patent Publication No. Hei 10-297956

[Patent document 2] Japanese Unexamined Patent Publication No. 2000-63171

[Patent document 3] Japanese Unexamined Patent Publication No. 2004-43955

[Patent document 4] Japanese Unexamined Patent Publication No. 2004-43956

[Patent document 5] Japanese Unexamined Patent Publication No. 2004-84016

[Patent document 6] Japanese Unexamined Patent Publication No. 2000-290062

[Patent document 7] Japanese Unexamined Patent Publication No. 2000-103614

[Patent document 8] Japanese Unexamined Patent Publication No. Hei 02-263794

[Patent document 9] Japanese Unexamined Patent Publication No. Hei 05-170430

[Patent document 10] Japanese Unexamined Patent Publication No. Hei 06-405887

[Patent document 11] Japanese Unexamined Patent Publication No. Hei 09-309799

[Patent document 12] Japanese Unexamined Patent Publication No. 2000-86400

[Patent document 13] Japanese Unexamined Patent Publication No. Hei 11-349399

DISCLOSURE OF THE INVENTION

Problems to be Solved by the Invention

An object of the present invention is to solve the above problems, and to provide a MgO single crystal used as a MgO deposition material which serves as a target material in depositing a MgO film on a substrate using a vacuum deposition method, such as an electron beam deposition method or an ion plating method, a MgO single crystal for obtaining a MgO single crystal substrate for forming, e.g., an oxide superconductor thin film, and a method for producing the MgO single crystal.

Means to Solve the Problems

Generally, the deposition rate depends on the evaporated amount of MgO from the deposition material, and a film having improved quality can be obtained by keeping the evaporation rate constant. Therefore, a deposition material capable of keeping the evaporation rate high is desired from the viewpoint of achieving both high productivity and excellent quality of the protective film. However, for example, in an electron beam deposition method, when the evaporation rate is improved by a method in which the surface area of the deposition material per unit area irradiated with an electron beam is increased, a frequency of splashing is increased, so that the evaporation rate markedly varies, which causes a problem in that the resultant film has poor quality.

The present inventors have made studies on the effect of the content of impurity elements in a deposition material and a distribution of the elements on a deposition rate and a frequency of splashing. As a result, they have found that, the deposition rate increases as the calcium (Ca) content of the deposition material increases, that the frequency of splashing is reduced when Ca elements do not form a Ca concentrated phase and are uniformly distributed in the deposition material, and that the amount of the Ca concentrated phases can be represented by a CV value that is indicating a variation in detected amounts of Ca fragment ions. CV value is determined by calculation from an average and a standard deviation of $^{40}Ca$+counts, i.e., CV value (%) =100×Standard deviation/Average. In addition, they have made studies on the electrofusion conditions for obtaining a single crystal having less Ca concentrated phases and Ca elements more uniformly distributed than those of the MgO single crystal deposition material. As a result, they have found that, when a raw material having a content CaG in a specific range and having a ratio of the CaG content to the SiO2 content (CaO/SiO2) in a specific range is used and, in the last stage of the electrofusion step which is a fusion process for MgO, at least one of the outer periphery portion and the bottom portion of an electric furnace is forced-cooled, Ca elements are distributed extremely uniformly without forming a Ca concentrated phase. Thus a MgO single crystal deposition material that is free of splashing is obtained, and the present invention has been completed.

Specifically, in the present invention, there is provided a MgO single crystal having a Ca content of $150 \times 10^{-6}$ to $1,000 \times 10^{-6}$ kg/kg and a silicon (Si) content of $10 \times 10^{-6}$ kg/kg or less, wherein the MgO single crystal has a variation of 30% or less in terms of a CV value in detected amounts of Ca fragment ions, as analyzed by TOF-SIMS with respect to the polished surface of the MgO single crystal.

In the present invention, there are provided a MgO single crystal deposition material obtained by pulverizing the above MgO single crystal so that the resultant MgO single crystal has a volume of $15 \times 10^{-9}$ to $1,200 \times 10^{-9}$ m$^3$, and a MgO single crystal substrate for forming a thin film, obtained by processing the above MgO single crystal.

Further, in the present invention, there is provided a method for producing a MgO single crystal, comprising the steps of: arc-electrofusing raw material MgO having a MgO purity of 98% or more and containing CaO and SiO$_2$, wherein the content of the CaO in the raw material MgO is $0.05 \times 10^{-2}$ to $0.50 \times 10^{-2}$ kg/kg, wherein the weight ratio of the CaO content to the SiO$_2$ content (CaO/SiO$_2$) is 0.5 or more; and, in the last stage of the arc-electrofusing step, forced-cooling at least one of the outer periphery portion and the bottom portion of an electric furnace.

The MgO single crystal of the present invention has a Ca content of $150 \times 10^{-6}$ to $1,000 \times 10^{-6}$ kg/kg and a Si content of $10 \times 10^{-6}$ kg/kg or less, and, when the concentrated phases of Ca elements form as small as possible and Ca elements are uniformly distributed in the MgO single crystal, the MgO single crystal can be prevented from splashing during the deposition. Specifically, the MgO single crystal has a variation of 30% or less in terms of a CV value in detected amounts of Ca fragment ions, as analyzed by TOF-SIMS (a time-of-flight secondary ion mass spectrometer) with respect to the polished surface of the MgO single crystal.

In the present invention, the TOF-SIMS analysis is conducted as follows. A sample for measurement is polished by lapping, polishing or the like to form a smooth surface. A predetermined region of the smooth surface is irradiated with a primary ion beam obtained by accelerating and focusing, e.g., $^{69}Ga^+$, thus achieving a mapping analysis of positive secondary ions. Then, a CV value determined by calculation from an average and a standard deviation of $^{40}Ca^+$ counts, i.e., CV value (%)=100×Standard deviation/Average, is used as a variation.

When the MgO single crystal has the CV value of more than 30%, fine Ca concentrated phases are present in the MgO single crystal, and hence the MgO single crystal causes splashing with remarkably increasing frequency. On the other hand, when Ca is uniformly present in the MgO single crystal without forming Ca concentrated phases, the MgO single crystal has a constant evaporation rate and hence forms a film having improved quality, and therefore the CV value is advantageously as small as possible. The CV value is preferably 25% or less, more preferably 20% or less.

Further, it is necessary that a Ca content of the MgO single crystal is $150 \times 10^{-6}$ to $1,000 \times 10^{-6}$ kg/kg. When the Ca content is less than $150 \times 10^{-6}$ kg/kg, there is a possibility that the improvement of the deposition rate aimed at by adding Ca is not achieved. On the other hand, when the Ca content is more than $1,000 \times 10^{-6}$ kg/kg, the deposition rate is improved. However, Ca content as an impurity in the resultant protective film is too large, and hence quality of the resultant protective film is possibly lowered. The Ca content is preferably $200 \times 10^{-6}$ to $800 \times 10^{-6}$ kg/kg.

Further, it is necessary that the Si content of the MgO single crystal is $10 \times 10^{-6}$ kg/kg or less. Si is likely to be reacted with Ca, and easily forms Ca concentrated phases. Therefore, when the Si content of the MgO single crystal is more than $10 \times 10^{-6}$ kg/kg, fine Ca concentrated phases dispersed in the MgO single crystal gather to form those having larger sizes, so that the MgO single crystal has increased evaporation rates in those regions, thus making it difficult to prevent the MgO single crystal from splashing. Such Ca concentrated phases having larger sizes have a low probability of presence, and therefore they often are not included in a predetermined observed area in the above-mentioned analysis by TOF-SIMS, and possibly do not affect the CV value. Therefore, it is important to control both the Si content and the CV value to be in the respective predetermined ranges for preventing the formation of Ca concentrated phases which cause the MgO single crystal to splash.

The MgO single crystal deposition material obtained by pulverizing the above MgO single crystal, so that the resultant MgO single crystal has a volume of $15 \times 10^{-9}$ to $1,200 \times 10^{-9}$ m$^3$, can be prevented from splashing, and is excellent as a deposition material for vacuum deposition.

Furthermore, a MgO single crystal substrate for forming a thin film, which is advantageously used in forming, e.g., an oxide superconductor thin film, can be obtained by processing the above MgO single crystal through a process, such as cleavage, lapping, or polishing.

Next, the method for producing a MgO single crystal of the present invention is described. When a MgO single crystal is produced using an arc-electrofusing method, the properties of a raw material MgO are important. The raw material MgO has properties such that it has a MgO purity of 98% or more and contains CaO and SiO$_2$, wherein the content of the CaO in the raw material MgO is $0.05 \times 10^{-2}$ to $0.50 \times 10^{-2}$ kg/kg, wherein the weight ratio of the CaO content to the SiO$_2$ content (CaO/SiO$_2$) is 0.5 or more. When the raw material has a CaO content of less than $0.05 \times 10^{-2}$ kg/kg, the Ca content of the MgO single crystal is extremely small, and hence the improvement of the deposition rate aimed at by the presence of Ca cannot be achieved. On the other hand, when the raw material has a CaO content of more than $0.50 \times 10^{-2}$ kg/kg, the Ca content of the MgO single crystal is too large and the resultant protective film has an increased Ca impurity content, which is lowering the film quality. Further, when the ratio of CaO to SiO$_2$ in the raw material MgO, i.e., Cao/SiO$_2$ is less than 0.5, the formation of Ca concentrated phases in the MgO single crystal cannot completely be prevented even when performing the forced-cooling control in the last stage of the arc-electrofusing step.

In the method for producing a MgO single crystal of the present invention, in the last stage of the arc-electrofusing step, at least one of the outer periphery portion and the bottom portion of an electric furnace is forced-cooled. The wording "the last stage of the arc-electrofusing step" means a period in the step after 70% or more of the total time of current flowing for electrofusion has lapsed wherein the total current flowing time is 100%. For example, when the total current flowing time is 40 hours, the last stage of the arc-electrofusing step means a period in the step after a current flowing time of 28 hours or more has lapsed. The time for forced cooling may be 3 to 30% of the total current flowing time. Examples of cooling methods are an air cooling method, a water cooling method and the like. The effect of the forced cooling has not yet been completely elucidated, but it is presumed that, by performing the forced cooling before completion of the arc electrofusion, the heat flux from the top surface of the fused liquid being heated to the forced-cooled surface is increased, so that the segregation coefficients of Ca and Si at the growing surface of MgO single crystal are individually changed, thus preventing the formation of Ca concentrated phases.

In the MgO single crystal of the present invention obtained by the above method, Ca contained as an impurity is uniformly dispersed without forming Ca concentrated phases. Therefore, when the MgO single crystal is used as a deposition material for MgO protective film, a constant evaporation rate from an evaporated surface can be kept, and hence is prevented from splashing, making it possible to obtain a protective film having improved quality. Further, when the MgO single crystal is used as a substrate for forming a thin film, such as a superconductor than film, a high-quality superconductor thin film can be formed.

EXAMPLES

The present invention will be described in more detail with reference to the following Examples, which should not be construed as limiting the scope of the present invention.

1. Preparation of MgO Single Crystal by Arc-Electrofusing Method

MgO Single Crystal A 5 tons of magnesia clinker (diameter: 5 mm or less) having a CaO content of $0.20 \times 10^{-2}$ kg/kg and an SiO$_2$ content of $0.17 \times 10^{-2}$ kg/kg was placed in an electric furnace having an inner diameter of 1.5 m and a height of 1.5 m to form a magnesia clinker layer having a thickness of 1.3 m. 2 tons of powdered magnesia having particle sizes preliminarily adjusted to 30 to 390 mesh was put on the resultant magnesia clinker layer from the upper portion of the electric furnace to form a magnesia powder layer having a thickness of 0.2 m. Then, using carbon electrodes deeply embedded in the electric furnace, an electric current was allowed to flow for 40 hours (electric power: 14,000 kWH) and forced-cooling the outer periphery portion of the electric furnace by air cooling was started 5 hours before completion of the current flow, then MgO single crystal A was obtained.

MgO Single Crystal B

MgO single crystal B was obtained in substantially the same manner as in MgO single crystal A except that the portion to be forced-cooled was changed to the bottom portion of the furnace.

MgO Single Crystal C

MgO single crystal C was obtained in substantially the same manner as in MgO single crystal A except that magnesia clinker having a CaO content of $0.08 \times 10^{-2}$ kg/kg and an SiO$_2$ content of $0.10 \times 10^{-2}$ kg/kg was used, and that an electric current was allowed to flow for 25 hours (electric power: 9,000 kWH) and forced-cooling the bottom portion of the furnace was started 3 hours before completion of the current flow.

MgO Single Crystal D

MgO single crystal D was obtained in substantially the same manner as in MgO single crystal A except that magnesia clinker having a CaO content of $0.30 \times 10^{-2}$ kg/kg and an SiO$_2$ content of $0.12 \times 10^{-2}$ kg/kg was used, and that an electric current was allowed to flow for 30 hours (electric power: 12,000 kWH) and forced-cooling the bottom portion of the furnace was started 7 hours before completion of the current flow.

MgO Single Crystal E

MgO single crystal E was obtained in substantially the same manner as in MgO single crystal A except that forced cooling was not conducted.

MgO Single Crystal F

MgO single crystal F was obtained in substantially the same manner as in MgO single crystal B except that magnesia clinker having a CaO content of $0.12 \times 10^{-2}$ kg/kg and an SiO$_2$ content of $0.31 \times 10^{-2}$ kg/kg was used.

The properties of MgO single crystals A to F and the properties of their raw materials are shown in Table 1.

TABLE 1

| | Properties of raw material | | | Preparation conditions | Properties of single crystal | | CV |
|---|---|---|---|---|---|---|---|
| | CaO $10^{-2}$ kg/kg | SiO$_2$ $10^{-2}$ kg/kg | CaO/SiO$_2$ | Portion forced-cooled | Ca $10^{-6}$ kg/kg | Si $10^{-6}$ kg/kg | Value % |
| Single crystal A | 0.2 | 0.17 | 1.2 | Furnace outer periphery portion | 254 | 5 | 21 |
| Single crystal B | 0.2 | 0.17 | 1.2 | Furnace bottom portion | 312 | 4 | 11 |
| Single crystal C | 0.08 | 0.1 | 0.8 | Furnace bottom portion | 187 | 2 | 8 |
| Single crystal D | 0.3 | 0.12 | 2.5 | Furnace bottom portion | 786 | 8 | 16 |
| Single crystal E | 0.2 | 0.17 | 1.2 | No forced cooling | 283 | 8 | 85 |
| Single crystal F | 0.12 | 0.31 | 0.4 | Furnace bottom portion | 391 | 24 | 59 |

1. Preparation and Evaluation of MgO Single Crystal Deposition Material

Example 1

MgO single crystal A was pulverized, and pulverized crystals with 4 mesh-pass and 5.5 mesh-on were used as a deposition material. From the resultant deposition material, 10 samples were randomly selected, and measured the volume by the below-mentioned method. A sample having the largest volume was subjected to TOF-SIMS analysis, and the remaining samples were subjected to ICP emission spectrometry. Then, with respect to the deposition material, a film was deposited using an electron beam deposition machine, and evaluated in respect of splashing, a deposition rate, and a secondary electron emission coefficient under the respective conditions shown below. The results are shown in Table 2.

Example 2

A deposition material was obtained in substantially the same manner as in Example 1 except that MgO single crystal B was used. The results of evaluations are shown in Table 2.

Example 3

A deposition material was obtained in substantially the same manner as in Example 1 except that MgO single crystal C was used. The results of evaluations are shown in Table 2.

Example 4

Evaluations were conducted in substantially the same manner as in Example 1 except that MgO single crystal D was pulverized, and pulverized crystals with 4.7 mesh-pass and 6.5 mesh-on were used as a deposition material. The results are shown in Table 2.

Example 5

Evaluations were conducted in substantially the same manner as in Example 1 except that pulverized crystals with 3.5 mesh-pass and 4 mesh-on were used as a deposition material. The results are shown in Table 2.

Example 6

Evaluations were conducted in substantially the same manner as in Example 1 except that pulverized crystals with 2.5 mesh-pass and 3.5 mesh-on were used as a deposition material. The results are shown in Table 2.

Example 7

Evaluations were conducted in substantially the same manner as in Example 1 except that MgO single crystal A was pulverized, and pulverized crystals with 6.5 mesh-pass and 8.6 mesh-on crystal were used as a deposition material. The results are shown in Table 2.

Example 8

Evaluations were conducted in substantially the same manner as in Example 1 except that MgO single crystal A was processed by cleavage into $12 \times 10^{-3}$ m, $12 \times 10^{-3}$ m, $10 \times 10^{-3}$ m, and sieved by means of a 7.5-mesh metal gauze to remove fine particles and resultant crystals were used as a deposition material. The results are shown in Table 2.

Comparative Example 1

Evaluations were conducted in substantially the same manner as in Example 1 except that MgO single crystal E was used. The results are shown in Table 2.

Comparative Example 2

Evaluations were conducted in substantially the same manner as in Example 1 except that MgO single crystal F was used. The results are shown in Table 2.

Comparative Example 3

Evaluations were conducted in substantially the same manner as in Example 1 except that high purity polycrystalline MgO having a purity of 99.93% by mass was granulated, and then molded using a mold having a diameter of $10 \times 10^{-3}$ m and a thickness of $2 \times 10^{-3}$ m under a pressure of $800 \times 10^4$ kg/m$^2$, and fired in an electric furnace at 1,873 K for 10,800 seconds (3 hours) and the resultant material was used as a deposition material. The results are shown in Table 2. The sintered material had a Ca content of $120 \times 10^{-6}$ kg/kg and a Si content of $45 \times 10^{-6}$ kg/kg.

TABLE 2

| | Raw material single crystal | Volume $10^{-9}$ m$^3$ | Deposition rate $10^{-9}$ m/s | Splash-ing | Secondary electron emission coefficient |
|---|---|---|---|---|---|
| Example 1 | Single crystal A | 42 | 3.5 | 1 | 0.59 |
| Example 2 | Single crystal B | 48 | 3.8 | 2 | 0.57 |
| Example 3 | Single crystal C | 53 | 3.4 | 1 | 0.56 |
| Example 4 | Single crystal D | 37 | 4.2 | 2 | 0.55 |
| Example 5 | Single crystal A | 150 | 3.3 | 1 | 0.59 |
| Example 6 | Single crystal A | 350 | 3.2 | 1 | 0.58 |
| Example 7 | Single crystal A | 12 | 3.8 | 3 | 0.49 |
| Example 8 | Single crystal A | 600 | 1.8 | 1 | 0.55 |
| Comparative Example 1 | Single crystal E | 51 | 3.3 | 4 | 0.42 |
| Comparative Example 2 | Single crystal F | 47 | 3.5 | 4 | 0.41 |
| Comparative Example 3 | Polycrystal | 157 | 2.2 | 4 | 0.39 |

1. Preparation and Evaluation of MgO Single Crystal Substrate for Oxide Superconductor Thin Film Example 9

MgO single crystal A was processed by cleavage, and subjected to lapping and polishing to obtain a substrate having a surface roughness Ra of $3 \times 10^{-10}$ m or less and a size of $10 \times 10 \times 0.5$ ($10^{-3}$ m). Then, an oxide superconductor thin film was formed on the substrate under the conditions shown below, and evaluated superconducting properties. The results are shown in Table 3.

Comparative Example 4

A substrate was prepared in substantially the same manner as in Example 9 except that MgO single crystal E was used, and a similar evaluation was conducted. The critical temperature (Tc) and the critical current density (Ic) were measured by a four-probe method. The results are shown in Table 3.

TABLE 3

| | Raw material single crystal | Tc K | Ic $10^4$ A/m$^2$ |
|---|---|---|---|
| Example 9 | Single crystal A | 117 | $4.8 \times 10^4$ |
| Comparative Example 4 | Single crystal E | 110 | $3.3 \times 10^3$ |

1. Method for Evaluation

TOF-SIMS Analysis

A sample for measurement was polished by lapping, polishing or the like to obtain a smooth surface having a surface roughness (Ra) of $1.0 \times 10^{-9}$ m. Using a TOF-SIMS (a time-of-flight secondary ion mass spectrometer)(TFS-2000, manufactured by Physical Electronics, Inc.), a region of $240 \times 10^{-6}$ m square of the polished sample was irradiated with a primary ion beam obtained by accelerating $^{69}$Ga$^-$ with 25 kV and focusing it to $\phi 1 \times 10^{-6}$ m, thus achieving a mapping analysis of positive secondary ions. A CV value determined by calculation from an average and a standard deviation of $^{40}$Ca$^+$ counts was used as a variation.

$CV$ Value=100×Standard deviation/Average

Method for Measuring an Impurity Content

The Ca and Si impurity contents were individually measured using an ICP emission spectrometer (SPS-1700VR, manufactured by Seiko Instruments Inc.), after dissolving a sample in an acid.

Method for Measuring a Volume

An external size of a deposition material was measured by means of a vernier caliper to determine a volume by calculation.

Method for Forming a MgO Protective Film

A film was deposited from the MgO single crystal deposition material on a stainless steel substrate for 60 seconds using an electron beam deposition machine. The thickness of the resultant film was measured to determine a deposition rate by calculation. Then, conditions for deposition were determined from the deposition rate, and a film was deposited so that the thickness of the film became $100 \times 10^{-9}$ m to obtain a sample for evaluation. The electron beam deposition was conducted with an acceleration voltage of 15 kV, a deposition pressure of $1 \times 10^{-2}$ Pa, and a deposition distance of 0.6 m.

Method for Evaluating Film Thickness

Ellipsometry was conducted using a single wavelength ellipsometer by irradiating a sample with a He—Ne laser (wavelength: $623.8 \times 10^{-9}$ m) at two different incident angles (55 degrees and 70 degrees) to determine a film thickness by fitting analysis.

Method for Evaluating Splashing

A state of a protective film being formed was visually observed through a window of the deposition machine, and the occurrence of splashing was evaluated in 1 to 5 ranks. A sample that did not splash was rated "1", and a sample that frequently splashed was rated "5".

Method for Measuring a Secondary Electron Emission Coefficient

A film sample obtained was placed in a target position of a secondary electron meter, and activated in a high vacuum, and then subjected to measurement of a secondary electron emission coefficient. In the measurement, the sample temperature was 573 K, and the ion acceleration voltage was 300 V.

Method for Forming a Superconductor Thin Film

A Bi—Sr—Ca—Cu—O superconductor thin film was deposited on the MgO single crystal substrate by an RF sputtering method. Conditions for deposition are as follows.

| | |
|---|---|
| Sputtering gas: | Ar:O$_2$ = 8:2 |
| Sputtering pressure: | 2 Pa |
| Substrate temperature: | 1,003 K |
| RF frequency: | 13.56 MHz |
| RF power: | 65 W |
| Deposition rate: | $1.4 \times 10^{-10}$ m/s |
| Film thickness: | $6,000 \times 10^{-10}$ m |
| Target composition: | Bi:Sr:Ca:Cu = 2.5:2.1:1.0:2.0 |

The superconductor thin film deposited under the above conditions was analyzed by a fluorescence X-ray analysis method. As a result, it has been found that the thin film has a composition of Bi:Sr:Ca:Cu=2:2:1:2. With respect to the superconducting properties of the Bi—Sr—Ca—Cu—O superconductor thin film, a critical temperature (Tc) and a critical current density (Ic) were measured by a four-probe method. The results are shown in Table 3.

As is apparent from the above results, when MgO protective films were formed by electron beam deposition method from deposition materials obtained from MgO single crystals A to D of the present invention as target materials, the deposition materials were prevented from splashing during the vapor deposition without reducing the deposition, rates, and further MgO protective films having excellent quality can be obtained. In addition, with respect to the MgO single crystals of the present invention used as deposition material, it has been found that the deposition materials are further surely prevented from splashing when the deposition materials obtained by pulverizing the MgO single crystals have volumes in a predetermined range. Further, it has been found that, when the MgO single crystal of the present invention is used as a substrate for forming a superconductor thin film, the resultant superconductor thin film has improved superconducting properties.

The invention claimed is:

1. A magnesium oxide single crystal having a calcium content of $150 \times 10^{-6}$ to $1,000 \times 10^{-6}$ kg/kg and a silicon content of $10 \times 10^{-6}$ kg/kg or less, wherein the magnesium oxide single crystal has a variation of 30% or less in terms of a CV value determined by calculation from an average and a standard deviation of $^{40}$Ca+ counts, as analyzed by TOF-SIMS with respect to the polished surface of the magnesium oxide single crystal, with an equation:

$$CV \text{ Value} = 100 \times \text{standard deviation/average}.$$

2. A magnesium oxide single crystal deposition material comprising the magnesium oxide single crystal according to claim 1 where the magnesium oxide single crystal is pulverized to have a volume of $15 \times 10^{-9}$ to $1,200 \times 10^{-9}$ m$^3$.

3. A magnesium oxide single crystal substrate for forming a thin film, comprising the magnesium oxide single crystal according to claim 1.

4. A method for producing a magnesium oxide single crystal according to claim 1, comprising the steps of:
 - arc-electrofusing in an electric furnace a raw material magnesium oxide having a magnesium oxide purity of 98% or more and containing calcium oxide and silicon dioxide, wherein the content of the calcium oxide in the raw material magnesium oxide is $0.05 \times 10^{-2}$ to $0.50 \times 10^{-2}$ kg/kg, wherein the weight ratio of the calcium oxide content to the silicon dioxide content (CaO/SiO2) is 0.5 or more; and,
 - in the last stage of the arc-electrofusing step, forced-cooling at least a periphery portion and a bottom portion of the electric furnace.

\* \* \* \* \*